United States Patent
Nashiki et al.

(10) Patent No.: US 9,260,777 B2
(45) Date of Patent: Feb. 16, 2016

(54) TRANSPARENT CRYSTALLINE ELECTRICALLY-CONDUCTIVE THIN FILM, METHOD OF PRODUCTION THEREOF, TRANSPARENT ELECTRICALLY-CONDUCTIVE FILM, AND TOUCH PANEL

(75) Inventors: Tomotake Nashiki, Ibaraki (JP); Tomonori Noguchi, Ibaraki (JP); Hideo Sugawara, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 866 days.

(21) Appl. No.: 11/917,110

(22) PCT Filed: Dec. 27, 2006

(86) PCT No.: PCT/JP2006/326065
§ 371 (c)(1),
(2), (4) Date: Dec. 10, 2007

(87) PCT Pub. No.: WO2007/086230
PCT Pub. Date: Aug. 2, 2007

(65) Prior Publication Data
US 2009/0117405 A1 May 7, 2009

(30) Foreign Application Priority Data
Jan. 30, 2006 (JP) ................. 2006-021048

(51) Int. Cl.
C23C 16/00 (2006.01)
C23C 14/08 (2006.01)

(52) U.S. Cl.
CPC .................. *C23C 14/086* (2013.01)

(58) Field of Classification Search
CPC ............. B32B 9/00; B05D 5/12; H01B 1/02; C23C 14/086
USPC ................................................. 427/160–169
See application file for complete search history.

(56) References Cited

U.S. PATENT DOCUMENTS

| | | | |
|---|---|---|---|
| 4,962,071 A * | 10/1990 | Bayard ......................... | 501/134 |
| 6,329,044 B1 | 12/2001 | Inoue et al. | |
| 6,433,913 B1 * | 8/2002 | Bauer et al. .................... | 359/265 |
| 7,534,500 B2 | 5/2009 | Kobayashi et al. | |
| 2002/0034836 A1 | 3/2002 | Kiyota et al. | |
| 2003/0011047 A1 * | 1/2003 | Cunningham et al. ........ | 257/614 |
| 2003/0134149 A1 * | 7/2003 | Miyashita et al. ............. | 428/690 |
| 2004/0012742 A1 * | 1/2004 | Ohnishi ......................... | 349/123 |
| 2004/0265602 A1 | 12/2004 | Kobayashi et al. | |
| 2008/0096013 A1 | 4/2008 | Nashiki et al. | |

FOREIGN PATENT DOCUMENTS

| | | |
|---|---|---|
| JP | 61-1227311 A | 10/1986 |
| JP | 2-194943 A | 8/1990 |
| JP | 4-308612 A | 10/1992 |
| JP | 10-49306 A | 2/1998 |
| JP | 2000-113732 A | 4/2000 |
| JP | 2000-42582 A | 2/2002 |
| JP | 2003-151358 A | 5/2003 |
| JP | 2003-257252 A | 9/2003 |
| WO | 2006/038494 A1 | 4/2006 |

OTHER PUBLICATIONS

Kim et al. Journal of Applied Physics, 86, No. 11, 1999. p. 6451-6461.*
Chinese Office Action dated Jul. 24, 2009, issued in corresponding Chinese Patent Application No. 200710148726.
Notification of Transmittal of Translation of the International Preliminary Report on Patentability (Form PCT/IB/338) of International Application No. PCT/JP2006/326065 mailed Aug. 14, 2008 with Forms PCT/IB/373, PCT/IB/326 and PCT/ISA/237.
International Search Report of PCT/JP2006/326065, date of mailing Apr. 3, 2007.
Japanese Submission of Information dated Jun. 1, 2012, issued in corresponding Japanese Patent Application No. 2006-21048, w/ English translation.
Taiwanese Office Action dated Sep. 14, 2012, issued in corresponding Taiwanese Patent Application No. 096100026, with English translation (7 pages).

* cited by examiner

*Primary Examiner* — Michael Cleveland
*Assistant Examiner* — Michael G Miller
(74) *Attorney, Agent, or Firm* — Westerman, Hattori, Daniels & Adrian, LLP

(57) ABSTRACT

A transparent crystalline electrically-conductive thin film of the present invention comprises an indium tin oxide as a main component, wherein the indium tin oxide contains 9% by weight or less of tin oxide based on the total amount of indium oxide and tin oxide, wherein the transparent crystalline electrically-conductive thin film contains 0.45 atomic % or less of nitrogen. The transparent crystalline electrically-conductive thin film of the present invention has a high resistance value and good reliability in a high-temperature, high-humidity environment.

15 Claims, No Drawings

TRANSPARENT CRYSTALLINE ELECTRICALLY-CONDUCTIVE THIN FILM, METHOD OF PRODUCTION THEREOF, TRANSPARENT ELECTRICALLY-CONDUCTIVE FILM, AND TOUCH PANEL

TECHNICAL FIELD

The present invention relates to a transparent crystalline electrically-conductive thin film and a method of production thereof. The transparent crystalline electrically-conductive thin film may be used for advanced display systems such as liquid crystal displays and electroluminescence displays and transparent electrodes in touch panels and used for electromagnetic wave shielding or prevention of static charge of transparent products.

BACKGROUND ART

Indium tin oxide (ITO) thin films are conventionally used as transparent electrically-conductive thin films, because of their excellent transparency. Among transparent electrically-conductive thin films for the above applications, for example, those for use in touch panels and the like are desired to have high resistance values, in view of position detection accuracy or power consumption. Transparent electrically-conductive thin films for the above applications are also desired to have satisfactory reliability in high-temperature, high-humidity environments (the smaller the rate of resistance value change, the higher the reliability). After formed, transparent electrically-conductive thin films may also be crystallized so as to have improved reliability.

However, conventional transparent electrically-conductive thin films using indium tin oxide thin films have low resistance values and insufficient reliability. The reliability can be improved by increasing a thickness of the transparent electrically-conductive thin film. However, such an increase in thickness can result in a reduction in transparency or resistance value and thus is not preferred. The reliability of the transparent electrically-conductive thin film can also be improved by increasing a content of tin oxide in the indium tin oxide thin film. However, too high tin oxide content can make the time for crystallization very long and thus is not preferred.

To solve the problems, it is proposed that an indium tin oxide thin film is doped with nitrogen (see Patent literature 1). Patent literature 1 discloses that in the nitrogen-containing transparent electrically-conductive thin film, a nitrogen content of 0.25% by weight or more based on the amount of indium tin oxide can be effective in improving the resistance value or reliability of the transparent electrically-conductive thin film. However, the transparent electrically-conductive thin film disclosed in Patent Literature 1 is amorphous, and crystallization thereof for a further improvement in the reliability requires a very long time.

Patent literature 1: Japanese Patent Application Laid-Open No. 04-308612

DISCLOSURE OF THE INVENTION

Problems to be Solved by the Invention

It is an object of the present invention to provide a transparent crystalline electrically-conductive thin film that has a high resistance value and good reliability in a high-temperature, high-humidity environment.

It is another object of the present invention to provide a transparent electrically-conductive film using the transparent crystalline electrically-conductive thin film and to provide a tough panel therewith.

It is a further object of the present invention to provide a method that can efficiently produce a transparent crystalline electrically-conductive thin film having a high resistance value and good reliability in a high-temperature, high-humidity environment.

Means for Solving the Problems

The inventors have made intensive investigations in order to achieve the above objects. As a result, the inventors have found that the above objects can be achieved with the transparent crystalline electrically-conductive thin film and the method of production described below and thus have completed the present invention.

The present invention relates to a transparent crystalline electrically-conductive thin film, comprising: an indium tin oxide as a main component, wherein the indium tin oxide contains 9% by weight or less of tin oxide based on the total amount of indium oxide and tin oxide, wherein the transparent crystalline electrically-conductive thin film contains 0.45 atomic % or less of nitrogen.

The transparent crystalline electrically-conductive thin film of the present invention comprises an indium tin oxide film containing at most the specific amount of tin oxide. A reduction in a resistance value can be controlled to be small with such a content of tin oxide so that a transparent electrically-conductive thin film with a high resistance value can be obtained. The transparent crystalline electrically-conductive thin film of the present invention also contains nitrogen and thus can have a further increased resistance value. The transparent electrically-conductive thin film of the present invention is crystalline and thus has high reliability in a high-temperature, high-humidity environment as compared with amorphous transparent electrically-conductive thin films. The addition of nitrogen can further improve the reliability. Since the transparent crystalline electrically-conductive thin film contains nitrogen in a very small amount such as 0.45 atomic % or less, the speed of the crystallization of the transparent electrically-conductive thin film is not reduced by the addition of nitrogen in a crystallization process. If the nitrogen content exceeds 0.45 atomic %, the crystallization speed can be undesirably reduced. As described above, the content of nitrogen in the transparent crystalline electrically-conductive thin film is very low, so that the nitrogen can be contained as a trace element at a level under the detection limit. However, if the atmosphere in which the transparent electrically-conductive thin film is produced contains nitrogen, nitrogen should be considered to exist in the transparent crystalline electrically-conductive thin film even with the nitrogen content less than the detection limit.

The present invention also relates to a transparent electrically-conductive film, comprising: a transparent film substrate; and the above transparent crystalline electrically-conductive thin film provided on one side of the transparent film substrate.

The present invention also relates to a touch panel, comprising: a pair of panel plates each having an electrically-conductive thin film and being placed opposite to each other with a spacer interposed therebetween, wherein at least one of the panel plates comprises the above transparent electrically-conductive film.

The present invention also relates to a method for producing the above transparent crystalline electrically-conductive thin film, comprising the steps of: forming a transparent electrically-conductive thin film of an indium tin oxide containing 9% by weight or less of tin oxide based on the total amount of indium oxide and tin oxide by a vapor method using a sintered mixture of indium oxide and tin oxide as a material for forming the transparent electrically-conductive thin film in an argon atmosphere containing argon gas and containing nitrogen gas in an amount of 3000 ppm to 13000 ppm based on the total amount of the argon gas and the nitrogen gas; and crystallizing the transparent electrically-conductive thin film by a heat treatment.

When the transparent crystalline electrically-conductive thin film of the present invention with a nitrogen content of 0.45 atomic % or less is produced by a vapor method, the film production may be performed in an argon atmosphere containing nitrogen gas in an amount of 3000 ppm to 13000 ppm based on the total amount of the argon gas and the nitrogen gas. If the content of the nitrogen gas in the argon atmosphere is less than 3000 ppm, a relatively small amount of nitrogen would be added to the transparent crystalline electrically-conductive thin film so that there can be scarce improvement in resistance value and that the reliability in the high-temperature, high-humidity environment can be insufficient. On the other hand, if the content of the nitrogen gas in the argon atmosphere is more than 13000 ppm, the process of crystallizing the transparent electrically-conductive thin film can take a long time, which is not preferred in view of production efficiency. From these points of view, the content of the nitrogen gas in the argon atmosphere is preferably from 3000 ppm to 12000 ppm based on the total amount of the argon gas and the nitrogen gas.

In the method for producing the above transparent crystalline electrically-conductive thin film, the argon atmosphere preferably contains oxygen gas.

In the production method of the present invention, the argon atmosphere may not contain oxygen as long as it contains nitrogen within the specific amount range, because an oxide, which is indium tin oxide, is used in the process of forming the transparent electrically-conductive thin film. However, the argon atmosphere may also contain oxygen. The addition of oxygen to the argon atmosphere allows high accuracy control of the transparency or resistance value of the film.

In the production method, the transparent crystalline electrically-conductive thin film may be formed on one side of a transparent film substrate. Thus, a transparent electrically-conductive film can be obtained.

In the production method, the heat treatment in the crystallization step may be performed at a temperature of 135° C. to 155° C. for 2.5 hours or less.

There is no particular limitation to the conditions for the heat treatment in the crystallization process. For example, a plastic substrate for use as the transparent film substrate can have degraded performance at high temperature. On the other hand, if the heating temperature does not reach a certain level, the crystallization speed can be so low that the production efficiency can be reduced. Thus, the heating temperature in the crystallization process is preferably from 135 to 155° C., more preferably from 140 to 155° C., still more preferably from 140 to 150° C. In the present invention, the content of nitrogen in the transparent electrically-conductive thin film to be subjected to the crystallization process is very low and thus does not reduce the crystallization speed. In the above range of heating temperature, therefore, the crystallization process can be completed in 2 hours or less, preferably in 1.5 hours or less, and thus the crystallization process can be efficiently performed.

BEST MODE FOR CARRYING OUT THE INVENTION

The transparent crystalline electrically-conductive thin film of the present invention is mainly composed of indium tin oxide and contains 0.45 atomic % or less of nitrogen.

Indium tin oxide is used as a material for the transparent crystalline electrically-conductive thin film, because it has good reliability in a high-temperature, high-humidity environment. If the content of tin oxide in indium tin oxide is high, however, the indium tin oxide may have a high resistance value and be crystallized at a low speed. Thus, the indium tin oxide preferably contains 9% by weight or less of tin oxide based on the total amount of indium oxide and tin oxide. From this point of view, the content of tin oxide in the indium tin oxide is preferably from 2 to 9% by weight, more preferably from 3 to 8% by weight.

In the transparent crystalline electrically-conductive thin film of the present invention, the material forming the thin film is crystallized. The thin film preferably has a crystal content of 50% by area or more, in view of reliability in a high-temperature, high-humidity environment. The crystal content is preferably 70% by area or more, more preferably 80% by area or more. The thin film may be entirely composed of crystals.

Concerning the crystals forming the transparent crystalline electrically-conductive thin film, the thin film preferably has a maximum grain size of 350 nm or less, more preferably of 250 nm or less, still more preferably of 150 nm or less. If the grain size is too small, a large part of the thin film can have a non-crystalline state so that the reliability in the high-temperature, high-humidity environment can be reduced. Thus, it is preferred that the grain size is too small. From this point of view, the maximum grain size is preferably 10 nm or more, more preferably 30 nm or more.

The maximum grain size and the grain distribution may be determined by observing the surface of the electrically-conductive thin film with a field emission transmission electron microscope (FE-TEM). The maximum grain size is the maximum diagonal or diameter of each observed polygonal or elliptical area. Specifically, the content of crystals with the maximum grain size corresponds to the area occupied by the respective grains per unit area (1.5 μm×1.5 μm) in the electron micrograph.

The transparent crystalline electrically-conductive thin film of the present invention generally has a thickness of 10 nm or more, preferably of 10 to 300 nm, more preferably of 15 to 100 nm, still more preferably of 20 to 70 nm. If the thickness is less than 10 nm, it can be difficult to obtain a continuous coating film with good electrical conductivity such as a surface resistance of $1\times10^3$ Ω/square or less. A too large thickness can often cause a reduction in transparency and the like.

The transparent crystalline electrically-conductive thin film of the present invention preferably has a surface resistance of 200 Ω/square or more, more preferably of 200 to 500 Ω/square so as to show a high resistance value.

In a method for producing the transparent crystalline electrically-conductive thin film of the present invention, a transparent electrically-conductive thin film is first formed by a vapor method using a sintered mixture of indium oxide and tin oxide as a target in an argon atmosphere containing argon gas and containing nitrogen gas in an amount of 3000 ppm to 13000 ppm based on the total amount of the argon gas and the nitrogen gas. In this process, nitrogen is added to the transparent electrically-conductive thin film.

The vapor method may be of any type, and examples thereof include electron beam deposition, sputter deposition, and ion plating. In particular, sputter deposition is preferred, because it can form a uniform thin film. When sputter deposition is used, radio frequency magnetron sputtering may be used.

As stated above, the content of nitrogen in the argon atmosphere is from 3000 ppm to 13000 ppm by volume based on the total amount of the argon gas and the nitrogen gas.

In addition to the nitrogen gas, the argon atmosphere may contain oxygen gas. The content of the oxygen gas may be, but not limited to, 2% or less, specifically from 0.3% to 2% by volume based on the amount of the argon gas. A high oxygen gas content is not preferred in view of crystallization by a heat treatment as described later, and thus the content of the oxygen gas in the argon atmosphere is preferably in the above range.

In a method for producing the transparent crystalline electrically-conductive thin film of the present invention, the transparent electrically-conductive thin film is then heat-treated to be crystallized. In the crystallization process, the heat treatment is performed at a temperature of 135 to 155° C. for 2.5 hours or less.

In the above production method, the transparent crystalline electrically-conductive thin film may be formed on various types of substrates. For example, the transparent crystalline electrically-conductive thin film may be formed on one side of a transparent film substrate, so that a transparent electrically-conductive film can be obtained.

Any appropriate material may be used for the film substrate. Examples of the material include polyester resins, acetate resins, polyethersulfone resins, polycarbonate resins, polyamide resins, polyimide resins, polyolefin resins, acrylic resins, polyvinyl chloride resins, polystyrene resins, polyvinyl alcohol resins, polyarylate resins, polyphenylene sulfide resins, polyvinylidene chloride resins, and (meth)acrylic resins. In particular, polyester resins, polycarbonate resins, and polyolefin resins are preferred.

A single piece of transparent film substrate may be used for the transparent electrically-conductive film. Alternatively, a laminate of two or more transparent film substrates bonded with a pressure-sensitive adhesive layer interposed therebetween may be used.

The transparent film substrate preferably has a thickness of about 75 to 400 μm, more preferably of 100 to 200 μm. If the thickness of the transparent film substrate is less than 75 μm, there may be a problem with reliability in high-temperature, high-humidity environment and a problem with workability. If the transparent film substrate has a thickness of more than 400 μm, the size of a touch panel part can be increased, and a relatively large load can be required for touch panel input operation.

When a laminate of two or more of transparent film substrates is used, at least one of the film substrates preferably has a thickness of 20 to 125 μm, while any appropriate thickness and any appropriate material may be selected for each film substrate.

Any transparent pressure-sensitive adhesive layer may be used when transparent film substrates are laminated to obtain a laminate. For example, an acrylic pressure-sensitive adhesive, a silicone pressure-sensitive adhesive, a rubber pressure-sensitive adhesive or the like may be used. After the bonding of the transparent substrates, the pressure-sensitive adhesive layer has a cushion effect and thus can function to improve the scratch resistance of the transparent crystalline electrically-conductive thin film formed on one side of the film substrate or to improve the tap properties thereof for touch panels. In terms of performing this function better, it is preferred that the elastic modulus of the pressure-sensitive adhesive layer is set in the range of 1 to 100 N/cm$^2$ and that its thickness is set at 1 μm or more, generally in the range of 5 to 100 μm.

The transparent crystalline electrically-conductive thin film may be formed on the film substrate with an anchor layer interposed therebetween. One or more anchor layers may be provided. The anchor layer may be made of an inorganic material, an organic material or a mixture of inorganic and organic materials. The formation of the anchor layer can improve adhesion between the film substrate and the transparent crystalline electrically-conductive thin film and is effective in improving the scratch resistance or bending resistance of the transparent crystalline electrically-conductive thin film and in improving tap properties for touch panels.

For example, such an inorganic material as $SiO_2$, $MgF_2$ or $Al_2O_3$ is preferably used to form the anchor layer. Examples of the organic material include acrylic resins, urethane resins, melamine resins, alkyd resins, and siloxane polymers. In particular, a thermosetting resin comprising a mixture of a melamine resin, an alkyd resin and an organosilane condensate is preferably used as the organic material.

The anchor layer may be formed with any of the above materials by vacuum deposition, sputtering, ion plating, coating, or the like.

When the transparent crystalline electrically-conductive thin film is formed, the surface of the film substrate may also be subjected to appropriate adhesion treatment such as corona discharge treatment, ultraviolet irradiation treatment, plasma treatment, and sputtering etching treatment, so that the adhesion to the transparent crystalline electrically-conductive thin film can be increased.

A hard coat layer can be formed on the transparent crystalline electrically-conductive thin film-free side of the film substrate. For example, the hard coating process may be performed by a method of applying and curing a hard resin such as an acrylic urethane resin and a siloxane resin. In the hard coating process, a silicone resin or the like may also be added to the hard resin such as the acrylic urethane resin or siloxane resin to form a roughened surface so that a non-glare face capable of preventing glare, which would otherwise be caused by mirror effect in practical use as a touch panel or the like, can be formed at the same time. An antifouling layer may also be formed on the hard coat layer.

If the hard coat layer being formed is thin, its hardness can be insufficient, while if the hard coat layer being formed is too thick, cracking can occur in some cases. Also taking curl preventing properties and the like into account, the thickness of the hard coat layer is preferably from about 0.1 to 30 μm.

The transparent electrically-conductive film of the present invention preferably has a light transmittance of 86% or more, more preferably of 88% or more, still more preferably of 90% or more. If the light transmittance of the transparent film substrate is less than 86%, the touch panel formed with the transparent electrically-conductive film of the present invention can produce a low-brightness display and can cause a problem with optical properties.

The transparent electrically-conductive film of the present invention is suitable for use as a panel plate in touch panels. Specifically, a touch panel may comprise a pair of panel plates each with a stripe-shaped transparent electrically-conductive thin film, which are arranged opposite to each other with a spacer interposed therebetween in such a manner that the stripe-shaped transparent electrically-conductive thin films are orthogonal and opposite to each other. In such a touch panel, the transparent electrically-conductive film as described above may be used as one of the panel plates (generally the upper panel plate to be pressed). Such a touch panel functions as a transparent switch structure in which contact between the transparent electrically-conductive thin films by tapping on the upper panel plate side against the elastic force of the spacer produces the ON state of an electric circuit, while removal of the press turns it to the original OFF state. The transparent electrically-conductive film of the present invention is used for any one of the upper and lower panel plates in the touch panel, while the other panel plate to be used may be a transparent substrate of a plastic film, a glass plate or the like, which is provided with a transparent electrically-conductive thin film. Alternatively, the transparent electrically-conductive film of the present invention may be used for both of the upper and lower plates.

EXAMPLES

The present invention is more specifically described below with some examples of the present invention in comparison with some comparative examples. Hereinafter, the term "part or parts" means part or parts by weight.

Example 1

Film Substrate

A transparent film substrate made of a 25 μm-thick polyethylene terephthalate film (hereinafter referred to as "the first PET film") was used.
(Formation of Anchor Layer)
A cured coating film (1.54 in refractive index, 150 nm in thickness) of a thermosetting resin composition composed of a melamine resin, an alkyd resin and an organosilane condensate (2:2:1 in weight ratio) was formed as a first anchor layer on one side of the first PET film. A silica sol (Colcoat P, manufactured by Colcoat Co., Ltd.) was diluted with ethanol to a solids concentration of 2%, and the diluted silica sol was applied to the first anchor layer by a silica coating method, dried at 150° C. for 2 minutes and then cured to form a $SiO_2$ thin film with a thickness of 30 nm as a second anchor layer.
(Formation of Transparent Crystalline Electrically-Conductive Thin Film)
A transparent electrically-conductive thin film (ITO thin film) with a thickness of 25 nm was formed on the second anchor layer by a sputtering method using a target of indium tin oxide (95% by weight of indium oxide and 5% by weight of tin oxide) in an argon atmosphere (argon gas:oxygen gas=100:1 (in volume ratio), with a nitrogen gas content of 6000 ppm (by volume) based on the total amount of the argon gas and the nitrogen gas) under a pressure of $4 \times 10^{-3}$ Pa. The thin film was then heat-treated at 150° C. for 1 hour (for the crystallization speed) to form a transparent crystalline electrically-conductive thin film so that a transparent electrically-conductive film was obtained.
(Formation of Hard Coat Layer)
One side of a 125 μm-thick PET film (hereinafter referred to as "the second PET film") was coated with a toluene solution prepared by adding 5 parts of hydroxycyclohexyl phenyl ketone (Irgacure 184 (trade name) manufactured by Ciba Specialty Chemicals Inc.) for serving as a photopolymerization initiator to 100 parts of an acrylic urethane resin (Unidic 17-806 (trade name) manufactured by Dainippon Ink and Chemicals, Incorporated) and diluting the mixture to a concentration of 50% by weight. The coating was dried at 100° C. for 3 minutes and then immediately irradiated with ultraviolet light from two ozone-type high-pressure mercury lamps (each 80 W/cm, 15 cm focused radiation) to form a 5 μm-thick hard coat layer.
(Formation of Transparent Electrically-Conductive Laminate)
An about 20 μm-thick transparent acrylic pressure-sensitive adhesive layer (an acrylic pressure-sensitive adhesive prepared by adding 1 part of an isocyanate crosslinking agent to 100 parts of a copolymer of a monomer mixture of butyl acrylate, acrylic acid and vinyl acetate (100:2:5 in weight ratio)) with a controlled elastic modulus of 10 $N/cm^2$ was formed on the other side of the second PET film opposite to the hard coat layer. The first PET film side (ITO thin film-free side) of the transparent electrically-conductive film was bonded to the pressure-sensitive adhesive layer side so that a transparent electrically-conductive laminate was prepared.
(Crystallinity)
With respect to grain size and grain size distribution, the transparent crystalline electrically-conductive thin film contained 80% by area or more of crystals with grain sizes of 300 nm or less. This result was obtained by observation and evaluation of the surface of the electrically-conductive thin film with a field emission transmission electron microscope (FE-TEM, HF-2000, Hitachi). Specifically, the maximum grain size was measured by the following method. The ITO film was first formed on the polyester film by sputtering. The film was then gently placed in a Petri dish. Hexafluoroisopropanol was gently poured into the Petri dish, and the polyester film was dissolved and removed. The ITO thin film was then taken out with a platinum mesh and fixed on the sample stage of the transmission electron microscope. In each example, the ITO film was photographed at a magnification of about 50000 to 200000 times, and the maximum size of grains sizes present in an area of 1.5 μm×1.5 μm was determined by observation.

Examples 2 to 8 and Comparative Examples 1 to 8

Transparent electrically-conductive laminates were prepared using the process of example 1, except that the content of tin oxide in indium tin oxide (ITO) and/or the content of nitrogen gas in the argon atmosphere were changed as shown in Table 1 when the transparent crystalline electrically-conductive thin film of example 1 was formed. The crystallization speed (temperature and time period) is also shown in Table 1.
The transparent electrically-conductive film and the transparent electrically-conductive laminate obtained in each of the examples and the comparative examples were evaluated as described below. The results are shown in Table 1.
<Nitrogen Content>
The nitrogen content (atomic %) of the transparent crystalline electrically-conductive thin film was measured by ESCA analysis. Specifically, the formed ITO film was subjected to argon ion etching, while the ratio between the constituent elements was measured with the following systems: measuring apparatus, Kratos AXIS-HSi manufactured by Shimadzu Corporation; analysis region (area), 300 μm×700 μm. The detection limit was 0.1 atomic % or less.
<Film Resistance>
The surface resistance (Ω/square) of the transparent electrically-conductive laminate was measured by four-terminal method.
<Total Light Transmittance>
Visible light transmittance was measured at a light wavelength of 550 nm with a spectroscopic analyzer UV-240 manufactured by Shimadzu Corporation.

<Reliability in High-Temperature, High-Humidity Environment>

The transparent electrically-conductive laminate obtained in each example was named as sample A. Sample A was allowed to stand in an environment at 85° C. and 85% R.H. for 500 hours. The treated sample was named as sample B. These samples were measured for surface resistance (Ω/square), and the ratio ($R_B/R_A$) of the resistance ($R_B$) of sample B to the resistance ($R_A$) of sample A was calculated to evaluate reliability.

TABLE 1

| | Content of Tin Oxide in Indium Tin Oxide (weight %) | Content of Nitrogen Gas in Argon Atmosphere (ppm) | Content of Nitrogen in Crystalline ITO (atomic %) | Evaluations | | | |
|---|---|---|---|---|---|---|---|
| | | | | Surface Resistance (Ω/square) | Total Light Transmittance (%) | Crystallization Speed (Temperature × Time) | Reliability ($R_B/R_A$) |
| Example 1 | 5 | 6000 | Detection Limit | 250 | 89.0 | 150° C. × 1 hour | 1.1 |
| Example 2 | 5 | 3000 | Detection Limit | 220 | 89.0 | 150° C. × 1 hour | 1.2 |
| Example 3 | 5 | 11000 | 0.3 | 320 | 89.0 | 150° C. × 1 hour | 1.1 |
| Example 4 | 5 | 6000 | Detection Limit | 280 | 90.0 | 150° C. × 1 hour | 1.3 |
| Example 5 | 5 | 6000 | Detection Limit | 220 | 88.5 | 150° C. × 1 hour | 1.1 |
| Example 6 | 3.3 | 6000 | Detection Limit | 340 | 89.0 | 150° C. × 1 hour | 1.4 |
| Example 7 | 7.5 | 6000 | Detection Limit | 200 | 88.5 | 150° C. × 1.5 hour | 1.1 |
| Example 8 | 5 | 12000 | 0.4 | 350 | 89.0 | 150° C. × 1 hour | 1.1 |
| Comparative example 1 | 5 | 500 | Detection Limit | 150 | 89.0 | 150° C. × 1 hour | 2.0 |
| Comparative example 2 | 5 | 18000 | 0.6 | 350 | 89.0 | 160° C. × 4 hour | 1.1 |
| Comparative example 3 | 5 | 14000 | 0.5 | 320 | 89.0 | 160° C. × 4 hour | 1.1 |
| Comparative example 4 | 10 | 6000 | Detection Limit | 200 | 88.5 | 160° C. × 5 hour | 1.0 |
| Comparative example 5 | 3.3 | — | — | 240 | 89.0 | 150° C. × 1 hour | 1.7 |
| Comparative example 6 | 5 | — | — | 170 | 89.0 | 150° C. × 1 hour | 1.3 |
| Comparative example 7 | 7.5 | — | — | 150 | 88.5 | 150° C. × 2 hour | 1.0 |
| Comparative example 8 | 10 | — | — | 150 | 88.5 | 160° C. × 5 hour | 1.0 |

In each example, the resulting transparent crystalline electrically-conductive thin film has a surface resistance of 200 Ω/square or more and good reliability in the high-temperature, high-humidity environment. In each example, the crystallization speed is high, and the production efficiency is good. In comparative examples having the above characteristics, however, the production efficiency is not good in any case.

The invention claimed is:

1. A method for producing a transparent crystalline electrically-conductive thin film comprising an indium tin oxide, said method comprising:
   forming a transparent electrically-conductive thin film of an indium tin oxide by a vapor method, and then
   crystallizing the transparent electrically-conductive thin film by a heat treatment,
   wherein the transparent electrically-conductive thin film of an indium tin oxide comprises indium tin oxide as the main component and up to 9% by weight of tin oxide based on the total amount of indium oxide and tin oxide,
   wherein the vapor method comprises a sintered mixture of indium oxide and tin oxide in an argon atmosphere containing argon gas and nitrogen gas and the nitrogen gas is in an amount of 3000 ppm to 13000 ppm based on the total amount of the argon gas and the nitrogen gas;
   wherein the transparent crystalline electrically-conductive thin film contains up to 0.45 atomic % of nitrogen, and wherein the transparent crystalline electrically-conductive thin film has a surface resistance of 200 Ω/square or more.

2. The method for producing the transparent crystalline electrically-conductive thin film according to claim 1, wherein the argon atmosphere contains oxygen gas.

3. The method for producing the transparent crystalline electrically-conductive thin film according to claim 2, wherein the content of the oxygen gas is 0 to 2% by volume based on the amount of the argon gas.

4. The method for producing the transparent crystalline electrically-conductive thin film according to claim 1, wherein the transparent crystalline electrically-conductive thin film is formed on one side of a transparent film substrate.

5. The method for producing the transparent crystalline electrically-conductive thin film according to claim 4, wherein the transparent film substrate is selected from the group consisting of polyester resins, acetate resins, polyethersulfone resins, polycarbonate resins, polyamide resins, polyimide resins, polyolefin resins, acrylic resins, polyvinyl chloride resins, polystyrene resins, polyvinyl alcohol resins, polyarylate resins, polyphenylene sulfide resins, polyvinylidene chloride resins, and (meth)acrylic resins.

6. The method for producing the transparent crystalline electrically-conductive thin film according to claim 4, wherein the thickness of the transparent film substrate is 75 μm to 400 μm.

7. The method for producing the transparent crystalline electrically-conductive thin film according to claim 4, wherein an anchor layer is interposed between the transparent film substrate and the transparent crystalline electrically-conductive thin film.

8. The method for producing the transparent crystalline electrically-conductive thin film according to claim 7, wherein the anchor layer is selected from the group consisting of $SiO_2$, $MgF_2$, $Al_2O_3$, acrylic resins, urethane resins, melamine resins, alkyd resins, and siloxane polymers.

9. The method for producing the transparent crystalline electrically-conductive thin film according to claim 4, wherein prior to forming the transparent crystalline electrically-conductive thin film on one side of the transparent film substrate, the transparent film substrate is undergoes an adhesion treatment.

10. The method for producing the transparent crystalline electrically-conductive thin film according to claim 1, wherein the heat treatment in the crystallization step is performed at a temperature of 135° C. to 155° C. for 2.5 hours or less.

11. The method for producing the transparent crystalline electrically-conductive thin film according to claim 1, wherein the indium tin oxide contains 2% to 9% by weight of tin oxide based on the total amount of indium oxide and tin oxide.

12. The method for producing the transparent crystalline electrically-conductive thin film according to claim 1, wherein the material for forming the transparent crystalline electrically-conductive thin film has a crystal content of 50% by area or more.

13. The method for producing the transparent crystalline electrically-conductive thin film according to claim 1, wherein the transparent crystalline electrically-conductive thin film contains crystals have a grain size of 10 nm to 350 nm.

14. The method for producing the transparent crystalline electrically-conductive thin film according to claim 1, wherein the transparent crystalline electrically-conductive thin film has a thickness of 10 nm to 300 nm.

15. The method for producing the transparent crystalline electrically-conductive thin film according to claim 1, wherein the transparent crystalline electrically-conductive thin film has a surface resistance of 200 Ω/square or more and $1\times10^3$ Ω/square or less.

* * * * *